United States Patent [19]
Zumoto et al.

[11] Patent Number: 5,223,693
[45] Date of Patent: Jun. 29, 1993

[54] OPTICAL MACHINING APPARATUS

[75] Inventors: Nobuyuki Zumoto; Toshinori Yagi; Yasuhito Myoi; Yoshie Uchiyama; Masaaki Tanaka; Teruo Miyamoto; Masao Izumo, all of Amagasaki, Japan

[73] Assignee: Mitsubishi Denki Kabushiki Kaisha, Tokyo, Japan

[21] Appl. No.: 659,691

[22] Filed: Feb. 25, 1991

[30] Foreign Application Priority Data

Apr. 28, 1990 [JP] Japan .................................. 2-114795
Jan. 21, 1991 [JP] Japan .................................. 3-004817

[51] Int. Cl.⁵ .............................................. B23K 26/00
[52] U.S. Cl. ........................ 219/121.68; 219/121.73; 219/121.75
[58] Field of Search ........... 219/121.68, 121.69, 219/121.73, 121.75, 121.78, 121.79

[56] References Cited

U.S. PATENT DOCUMENTS 3,545,733 12/1970 Caddell .......................... 215/121.69
3,588,435 6/1971 Heller .............................. 215/121.75
3,742,182 6/1972 Saunders ....................... 219/121.71
4,390,994 6/1983 Roberts et al. ..................... 372/99
4,942,588 7/1990 Yasui et al. ....................... 372/103

FOREIGN PATENT DOCUMENTS 1765145 2/1972 Fed. Rep. of Germany .
63-220991 9/1988 Japan .

OTHER PUBLICATIONS

English Abstract of Japanese Patent Application 63-140787.

Primary Examiner—C. L. Albritton

[57] ABSTRACT

An optical machining apparatus for irradiating light from a light source onto a source to be machined to form a grooves in the surface. The apparatus uses a mask disposed in the path of light from the light source. The mask includes reflective parts for reflecting the light from the light source. The reflective parts are on a first surface of the mask. The mask also includes a reflection member for returning the light reflected at the reflective parts of the mask toward the mask.

11 Claims, 12 Drawing Sheets 119  118

118  115  117

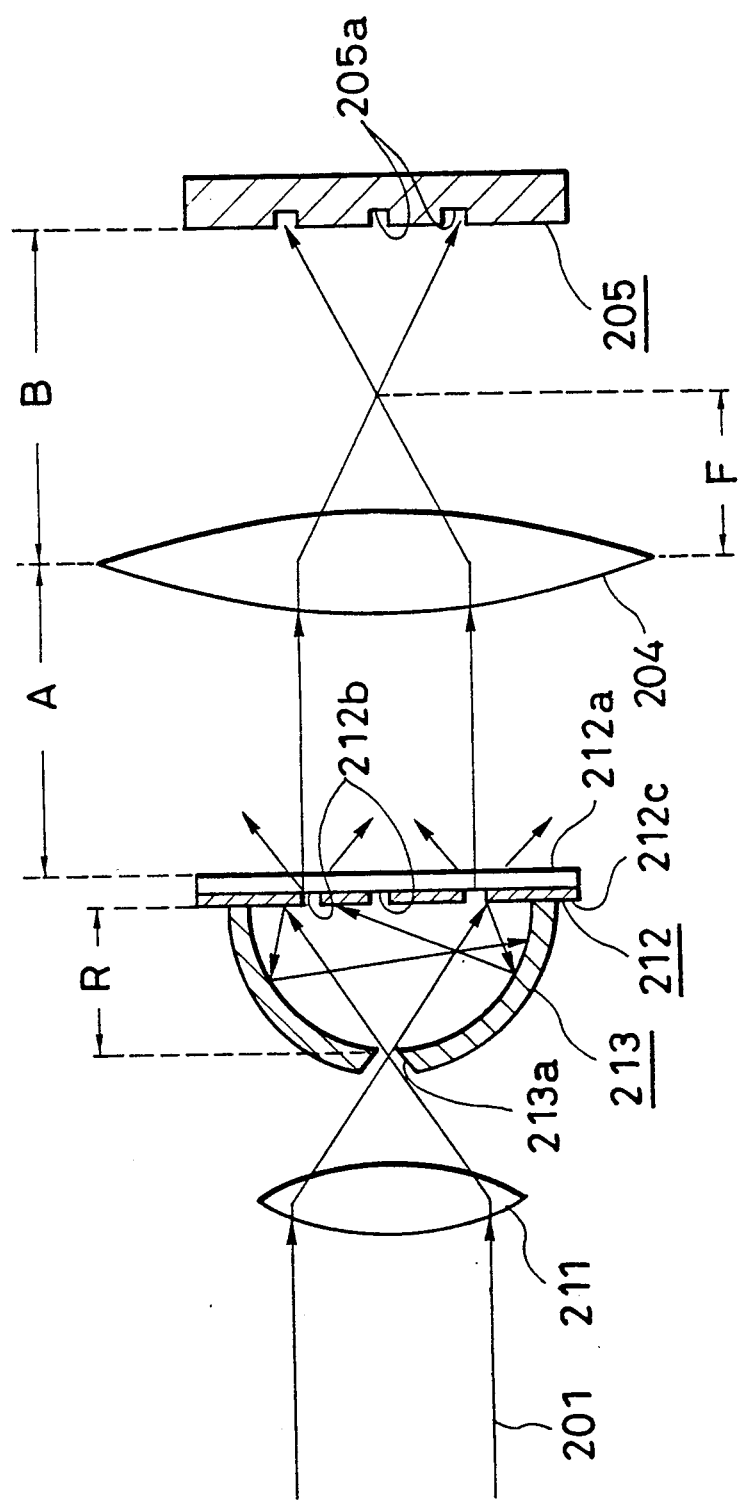

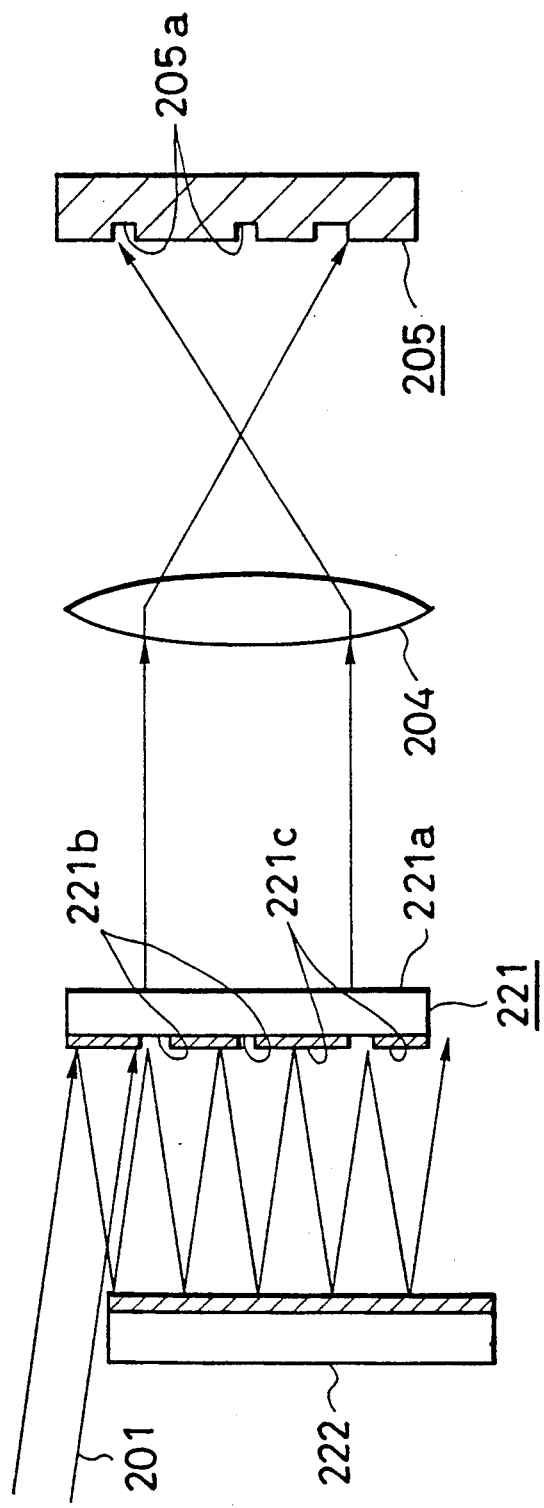

OPTICAL MACHINING APPARATUS

FIELD OF THE INVENTION

The present invention relates to an optical machining apparatus which uses a laser beam and a mask to form holes, such as via holes in a printed wiring board, for example.

BACKGROUND OF THE INVENTION

An example of prior art optical machining apparatus disclosed in Japanese Patent Kokai Publication No. 220991/1988 is illustrated in FIG. 1 and FIG. 2. FIG. 1 is a schematic diagram of the apparatus, and FIG. 2 is a plan view of the mask showing an example of the pattern of the mask.

As illustrated in these figures, a light source, which is in the form of an KrF excimer laser oscillator 101, emits a laser beam 107 of a wavelength of 248 nm. The laser oscillator 101 comprises a full-reflecting mirror 102, a laser output mirror 103 having a certain light transmission coefficient t ($<1$), and laser medium 104 filled between the mirrors 102 and 103. A mask 105 is provided with apertures having a pattern corresponding to the pattern which is desired to be created on a workpiece 109 by the optical machining.

The light beam 107 which is emitted from the light source 101 is expanded by a beam expander 106, and part of the light beam 107 which is incident at the aperture pattern on the mask 105 is passed through the mask 105.

The mask 105 comprises a transparent plate 105a formed of a synthetic quartz which permits passage of light and light nontransmissive parts 105c formed to leave light-transmissive parts 105b of a certain pattern. The light from the light source 101 is passed through the transparent parts 105a.

In FIG. 2, the pattern 105b is shown to be continuous. But this is for convenience of illustration. Actually, the pattern 105b is formed of a multiplicity of light-transmissive windows of about 20 μm in diameter arranged to form the pattern 105b. About 100 such light-transmissive windows are present per 1 cm². The aperture proportion (the ratio of the area of the pattern 3b forming the light-transmissive parts to the entire mask area) is about 0.03%.

An image-forming lens 110 having a focal length F is provided, being separated from the mask 105 by a distance A. A printed wiring board of polyimide which is a workpiece to be machined is placed at a distance B from the image-forming lens 4.

By the action of the image-forming lens 110, the part of the laser beam, 111, that is passed through the aperture pattern 105b of the mask 105 is passed through an image-forming optical system 110, and is image-formed on the surface of the workpiece 109.

Operation will now be described. The laser beam generated by oscillation of the laser oscillator 101 and is emitted through the laser output mirror 103, as indicated by reference numeral 107, is expanded by the expander 106 to the size of the area of the mask 105, and is irradiated on the mask 105. The mask 105 has a certain pattern 105b shown in FIG. 2 where it permits passage of the laser beam 107. The laser beam 107 is thereafter incident on the image-forming lens 110, and is projected on the workpiece 109 if the relationship:

$$1/A + 1/B = 1/F$$

holds. The image as projected on the workpiece 109 is an inversion of the pattern 105b. The machining of through-holes, such as via-holes is thereby effected on the workpiece 109 in accordance with the pattern. The magnification factor of the projected image relative to the pattern 105b on the mask 105 is B/A.

The aperture proportion of the mask 105 is as small as 0.03%, and the rest of the light, which amounts to 99.97% of the total incident light, is absorbed or reflected by the mask 105.

As the prior art laser machining apparatus configured as described above, the laser beam is emitted through the semi-transparent film, the power density is low. Moreover, the laser beam irradiated on the mask is mostly absorbed or reflected by the mask magneto-optic information recording medium 105, the most (99.97%, in the above example) of the energy of the laser beam is not actually utilized for the machining but is wasted, and the utilization factor of light is low.

SUMMARY OF THE INVENTION

An object of the invention is to improve the utilization factor of light.

An optical machining apparatus according to one aspect of the invention is for irradiating light from a light source onto a surface to be machined, to form holes through said surface, and comprises:

a mask disposed in the path of light from said light source to said surface, and having reflective parts for reflecting the light from said light source on a first surface on which it receives the light from said light source, and light-transmissive parts having desired pattern and permitting the light from said light source to pass therethrough; and reflection means for returning the light reflected at the reflective parts of the mask toward the mask.

An optical machining apparatus according to another aspect of the invention is for irradiating light from a light source onto a surface to be machined, to form holes through said surface, and comprises:

a plurality of converging means for converging the light from the light source onto said surface.

BRIEF DESCRIPTION OF THE DRAWINGS

FIG. 7 is a schematic diagram of a further embodiment of the present invention.

FIG. 8 to FIG. 13 are schematic diagrams of further embodiments of the present invention.

DETAILED DESCRIPTION OF THE EMBODIMENTS

Figure 3:
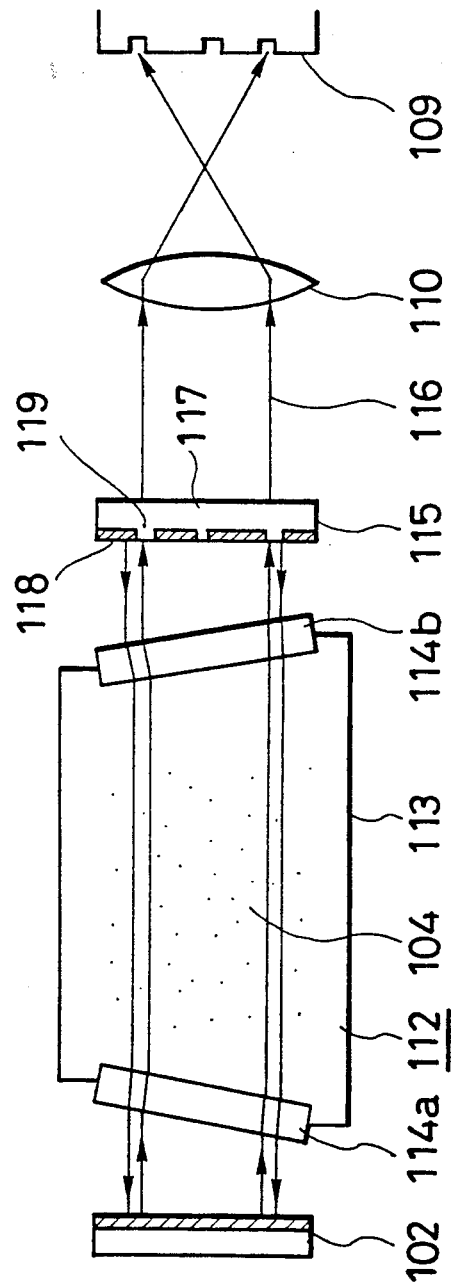
FIG. 3 is a schematic diagram of an embodiment of optical machining apparatus according to the present invention.

An embodiment of the present invention will now be described with reference to FIG. 3. As illustrated, the optical machining apparatus of this embodiment comprises a laser oscillator 112 having a discharge tube 113 filled with a laser medium 104 and provided with two windows 114a and 114b disposed at two opposite ends of the discharge tube 113. A full mirror 102 is disposed facing one window 114a to reflect the light emitted from the window 114a back through the window 114a into the discharge tube 113. A mask output mirror 115 is provided facing the other window 114b to reflect most of the light emitted from the window 114b back through the window 114b into the discharge tube 113.

Figure 4A:
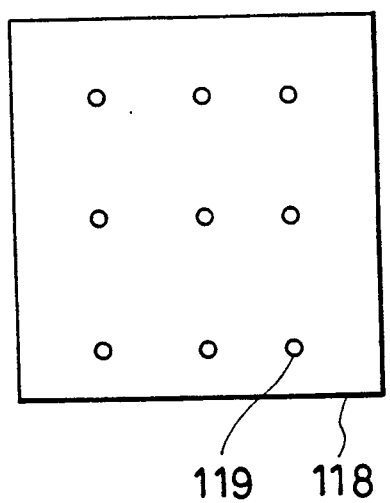
FIG. 4A and FIG. 4B are front view and a sectional view showing a mask output mirror of the optical machining apparatus of the embodiment of FIG. 3.
Figure 4B:
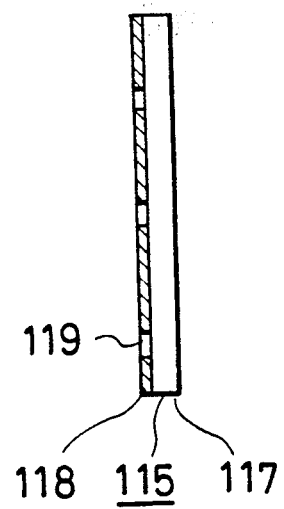

As illustrated in FIG. 4A and FIG. 4B, the mask output mirror 115 comprises a transparent plate 117, and a reflection film 118 formed on the transparent plate 117, formed of a material having a high reflective coefficient, and provided with a desired pattern of apertures 119. The part of the laser beam emitted from the window 114b and incident on the mask output mirror 115, at the pattern of the apertures 119, is passed through the mask output mirror 115. An image-forming optical system 110 forms an image of the pattern of laser light 116 passing through the mask output mirror 115 onto a workpiece 109.

The operation of the above apparatus will now be described. Laser oscillation takes place by virtue of the full mirror 102 and the mask output mirror 115. Since the reflection film 118 of the mask output mirror 115 is provided with apertures 119, part of the laser beam passes through the mask output mirror 115. The laser beam 116 that has passed through the mask output mirror 115 is projected by the image-forming optical system 110 onto the workpiece 109, so the workpiece 109 is machined to have a pattern corresponding to the pattern of the apertures of the mask output mirror 115. The laser beam that is reflected by the reflection film 118 is returned to the oscillator 112 and utilized again.

Assume that the copper polyimide board is subjected to via-hole machining with 100 holes of a diameter of 20 $\mu$m within a square of 1 cm × 1 cm. The aperture proportion (the ratio of the total area of the parts where the light is passed and the total areas of the mask) is as low as 0.03%, and 99.97% of the laser light is returned to the oscillator 12, and is utilized to enhance the intensity of the laser light. The laser light 116 of the desired pattern has the intensity substantially equal to the intensity of the laser light within the laser oscillator 112.

In the case of $CO_2$ laser, the transmission coefficient of the laser output mirror (half mirror) 113 in the conventional apparatus is about 10%. If it is assumed that the intensity of the laser light in the embodiment of the invention described above is identical to that of the conventional apparatus, the laser light as irradiated onto the workpiece is about 10 times that in the conventional apparatus. In the case of excimer laser which improves the machining precision, the laser output mirror 103 is about 90%. If the mask output mirror of the present invention is utilized, and if it is assumed that the intensity of the laser light within the laser oscillator is identical to that in the conventional apparatus, the laser light as irradiated onto the workpiece is 1.1 times (10% higher than) that in the conventional apparatus.

Figure 5:
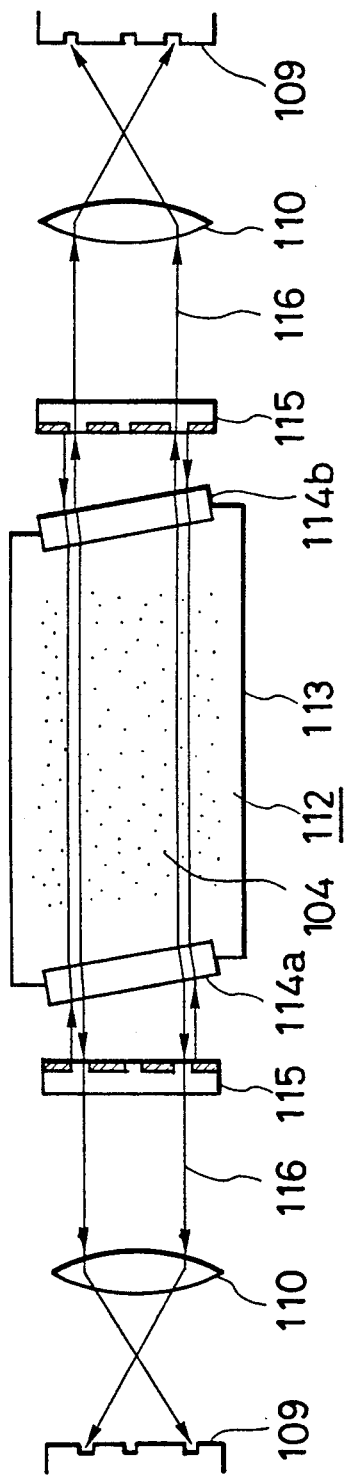
FIG. 5 is a schematic diagram showing another embodiment of the present invention.

In the above embodiment, one of the two mirrors forming the resonator is a full mirror 102, while the other is a mask output mirror 115. But, as shown in FIG. 5, the full mirror 102 of the embodiment of FIG. 3 may be replaced with another mask output mirror 115. In other words, two mask outputs mirrors 115 may be provided facing the two windows 114a and 114b. The laser light output through both mask output mirrors are projected by respective image-forming optical systems 110 onto respective workpieces 110. This arrangement permits two workpieces to be machined concurrently.

Figure 6:
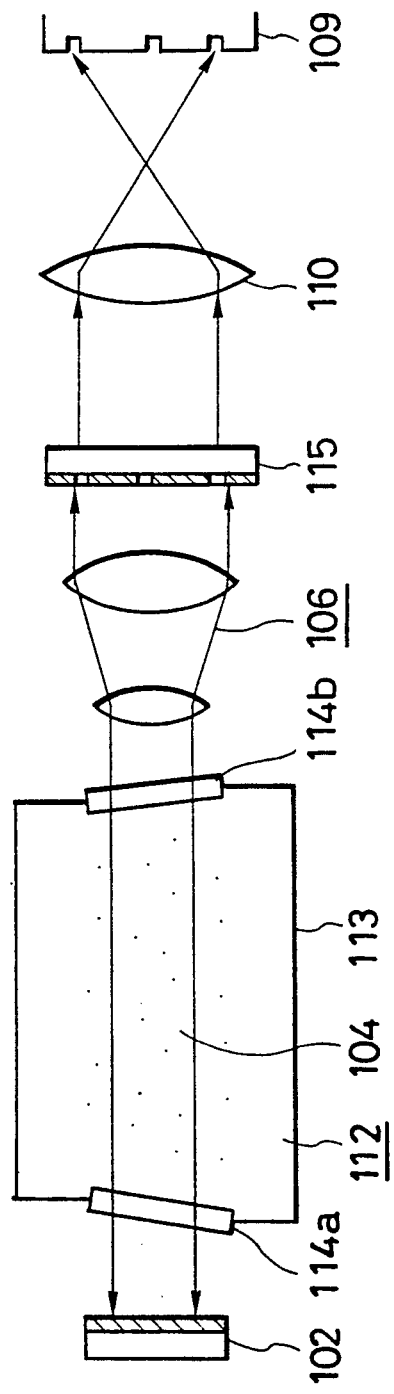
FIG. 6 is a schematic diagram of a further embodiment of the present invention.

As shown in FIG. 6, a beam expander 106 may be inserted between the mask output mirror 115 and the window 114. This arrangement permits use of a mask of a larger size.

The image-forming optical systems employed in the above embodiments are shown to comprise a single lens, but other types of image-forming optical systems may be used instead.

The aperture proportion of the mask pattern provided on the mask output mirror may be varied as long as the laser oscillation is sustained.

As has been described according to the embodiments of FIG. 3 to FIG. 6, the oscillator output mirror which serves to sustain laser oscillation and also guides the laser beam out toward a workpiece is formed of a transparent plate and a mask consisting of a reflection film having a desired pattern of apertures. The laser beam can therefore be utilized with a high efficiency.

A further embodiment of the invention will now be described with reference to FIG. 7. In FIG. 7, a laser beam 201 is emitted from a KrF excimer laser having a wavelength of 248 nm. A converging lens 211 converges the laser beam 201. A mask 212 comprises a transparent plate 212a consisting of a synthetic quartz plate, and a reflection film 212c consisting of an aluminum film that is formed by evaporation on the transparent plate 212a to leave a desired pattern 212b. The reflection factor of the reflection film 212c is 90% or more. A semi-spherical mirror 213 with a radius R serves as a reflection means, has its open end in abutment with the mask 212, and has a hole 213a on an axis which passes through the center of the sphere and is normal to the surface of the mask 212. The hole 213a is for permitting passage of the laser beam 201 toward the mask 212. The light which is reflected on the reflection film 212c of the mask 212 back to the semi-spherical mirror 213 is reflected on the inner surface of the semi-spherical mirror 213 back toward the mask 212. The reflection can be repeated until the light finally passes through the pattern of opening 212b and is used for the machining of the workpiece 205. The rest of the configuration is identical to that described in connection with the prior art, so its description is omitted.

Operation will now be described. The laser beam 201 is converged by the converging lens 211, and is made to pass through the hole 213a of the semi-spherical mirror 213. If the hole 213a is disposed near the focal point of the converging lens 212, most of the laser beam can pass through the hole 213 even if the hole 213a is very small. The laser beam 201 that has passed through the hole 213a is irradiated on the mask 212. Part of the laser beam 201 passes through the pattern 212b of the mask 212, and rest of the laser beam 201, which amounts to most of the laser beam 201, is reflected on the reflection film 212c, and is then reflected on the semi-spherical mirror 213. The light reflected on the semi-spherical mirror 213 is again irradiated on the mask 212, and part of it passes through the pattern 212b of the mask 212. The rest of it is reflected back toward the semi-spherical mirror 213. In this way, the laser light repeats the irradiation on the mask 212, the reflection at the reflection film 212c of the mask 212 and the semi-spherical mirror 13, and each time the laser beam 201 is irradiated on the mask 212, part of it is passed through the pattern 212b of the mask 212. The light that passes through the pattern 212b after reflections adds to the light which passes through the pattern 212b upon the initial irradiation. Accordingly, the light with a greater strength is passed through the image-forming lens 204, and is utilized for the machining of via-holes 205a on the printed wiring board 205. Thus, the light that is irradiated on the workpiece is enhanced, compared with the prior art where the light which passes only the initial irradiation is utilized.

Figure 8:
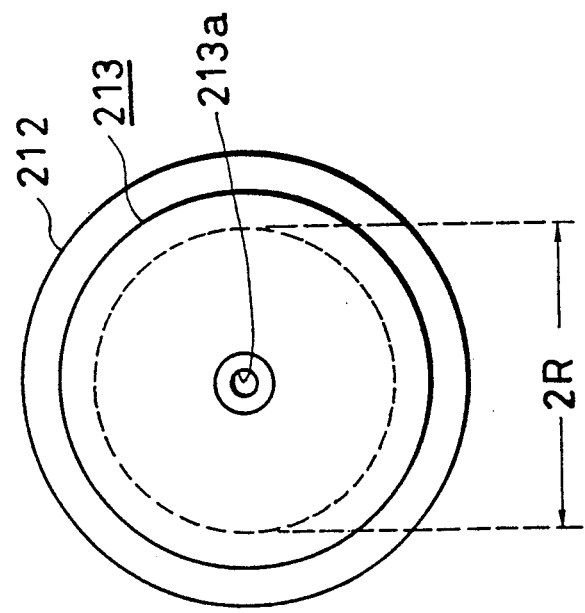

The reason why the laser beam 201 that passes through the pattern 212b of the mask 212 is more intense than that of the prior art apparatus will now be described. To simplify the explanation, it is assumed that the effective reflection surface of the reflection film 212c of the mask 212 on which the laser beam 201 is irradiated is in the form of a disk having a radius R, as shown in FIG. 8. The areas S0 and S1 of the surfaces of the mask 212 and the semi-spherical mirror 213 at which the laser beam 201 is reflected are given as follows:

$$S0 = \pi R^2$$

$$S1 = 2\pi R^2 = 2S0.$$

Now the intensity $I0$ of the laser beam 201 which is initially irradiated on the mask 212, and the intensity $I1$ of the laser beam 201 which is irradiated on the mask 12 after having been reflected on the reflection film 212c of the mask 212 and the semi-spherical mirror 13 will be calculated. Let us assume the output of the laser beam 201 to be P, then $I0$ will be given as follows:

$$I0 = P/S0.$$

$I1$ is the sum of the intensities of light beams which are irradiated after being reflected at the mask 212 and the semi-spherical mirror 213. Assuming that the semi-spherical mirror 213 has a perfect semi-spherical shape, the result of the calculation will be as follows:

$$I1 = (P/S) \cdot \rho/(1-\rho)$$

$$S = S0 + S1 = 3S0$$

where
$\rho$ represents the reflection coefficient of the reflection surface; and
S represents the area of reflection.

The total intensity of the laser beam 201 irradiated on the mask 212 is given as follows:

$$I = I0 + I1 = I0 + (I0/3) \cdot \rho/(1-\rho).$$

The reflection coefficient $\rho$ of the reflection film 212c consisting of an aluminum evaporated film is 0.9 or more, so $$I \geq 4 \times I0.$$

The intensity of the laser beam 201 irradiated on the mask 212 is more than 4 times the intensity, $I0$, in the conventional apparatus, and the utilization factor of the laser beam 201 is thus much higher.

In the embodiment described, the reflection film 212c consists of aluminum evaporated film, but it may alternatively be formed of multi-layered dielectric film.

Figure 9:
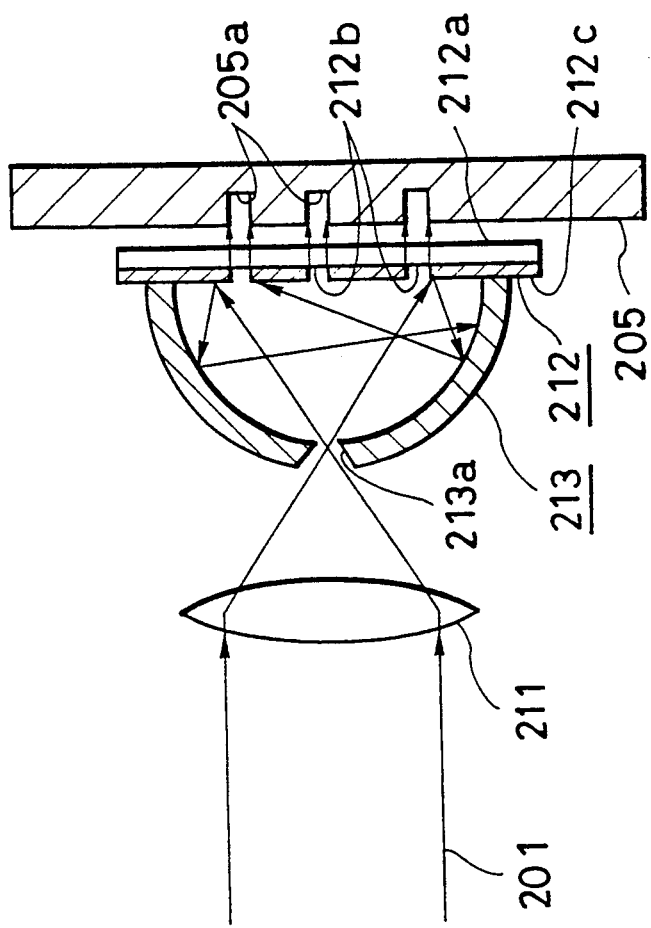

In the embodiment described, the light passing the mask 212 is transferred onto the printed wiring board 205 by means of an image-forming lens 204. Alternatively, the printed wiring board 205 may be provided adjacent the mask 212 as shown in FIG. 9, and similar effects are still obtained.

In the embodiment described, a semi-spherical mirror 212 is used, but a mirror of paraboloid of revolution, or some other shape may be used in place. The mirror may be formed to have a continuous curved surface, or the mirror surface may be formed of an assembly of a number of small flat mirrors arranged to form, in approximation, a desired reflection surface.

FIG. 10 shows a further embodiment of the invention. In the figure, a mask 221 comprises a transparent plate 221a formed of synthetic quartz plate and a multi-layered dielectric film 221c forming an aperture pattern 221b and having a reflection factor of 99%. A flat mirror having a reflection surface formed of a multi-layered dielectric film having a reflection factor of 99% is provided in parallel with an in opposition to the reflection film 221c of the mask 221.

The operation will now be described. The laser beam 210 is irradiated from obliquely above onto the upper end portion of the mask 221. The laser beam 201 repeats reflection on the reflection film 221c and the flat mirror 222, until it reaches the lower end of the mask 221. When the laser beam 201 is initially irradiated or irradiated after reflections onto the mask, part of the laser beam 201 is passed through the aperture pattern 221b, and is passed through the image-forming lens 204, and is used for the machining of the workpiece 205 in the same way as in the conventional apparatus. The angle at which the laser beam 201 is initially incident on the mask 221 is so determined that the succession of the irradiations covers all the areas of the mask 221, preventing unirradiated areas from being created between areas covered by successive irradiations. The laser beam 201 is not reflected at the aperture pattern 221b, and voids are created in the laser beam, but the distance between the mask 221 and the flat mirror 222 is sufficiently large compared with the width of the pattern 221b (exactly, the assembly of the light-passing windows having a diameter of 20 μm), and is, for example, 20 mm, so the voids are filled, due to diffraction, while the laser beam 201 having been reflected on the mask 221 travels to the flat mirror 222, and travels back to the mask 221.

Figure 1:
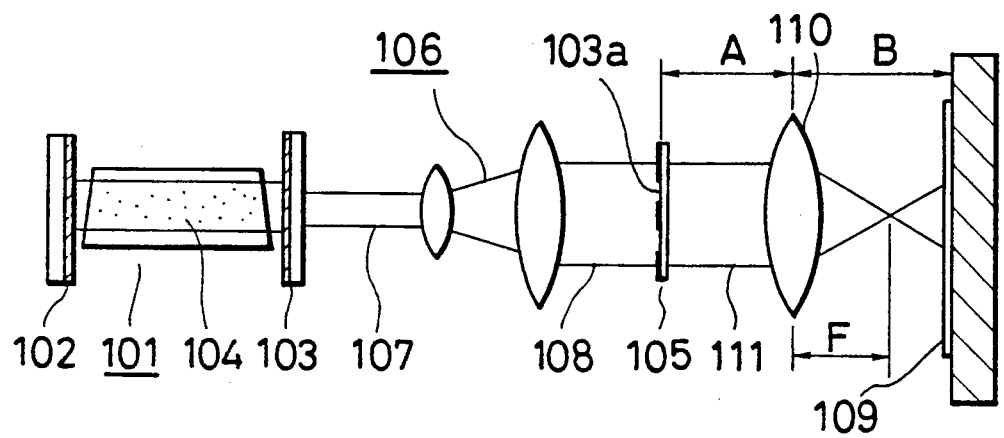
FIG. 1 is a schematic diagram of an example of prior art optical machining apparatus apparatus.
Figure 2:
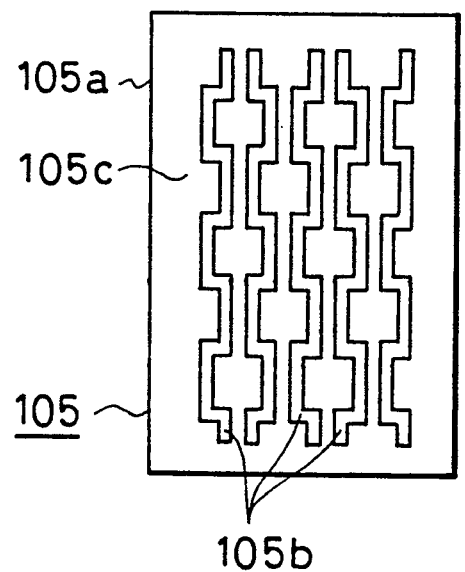
FIG. 2 is a plan view of the mask showing an example of the pattern of the mask.

Since the beam that is once irradiated on the mask 221 is repeatedly irradiated on the mask 221, after reflections, the utilization factor is high. This will be explained more specifically. Let us assume that, in FIG. 10, the output of the laser beam 201 is P, cross section of the beam is in the form of a rectangle of 10 mm × 30 mm, the mask 221 is in the form of a square of 30 mm × 30 mm, and the aperture proportion of the pattern 221b is 0.03% as in the prior-art example of FIG. 2.

The laser beam 201 having an intensity of $I0$ is emitted from a beam source, and is shaped, by a collimator (not shown), into a beam having a cross section of a rectangle of 2 mm × 30 mm, being compressed to 1/5 of the original beam. The intensity I of the beam is then 5 times the intensity I0 of the original beam. This laser beam of intensity I is irradiated from obliquely above onto the mask 221, and is thereafter repeatedly reflected and irradiated. The part of the laser beam that is incident at the pattern 221b is passed, but as the aperture proportion is as low as 0.03%, and the loss due to the passage through the pattern 221b is smaller than the loss of 1% during the reflection on the reflection film 221c and the flat mirror 222. The loss due to the passage at the pattern 221b is neglected. The reflection is repeated eight times. The intensity of the laser beam after the eight reflections is $0.99^8$–0.92 times the initial intensity. The attenuation factor is therefore 0.92%, and there is a decline of about 8% in the intensity of the laser beam irradiated at the lower end compared with the intensity of the laser beam at the upper end. That is, the intensity of the laser beam irradiated at the lower end is $0.92 \times 5 \times I0$. In the prior art of FIG. 2, the intensity of the laser beam irradiated on the mask 103 is equal to the initial intensity I0. Accordingly, the intensity of the laser beam in the embodiment of FIG. 10 is at least 4.6 times that of the prior art.

Figure 11:
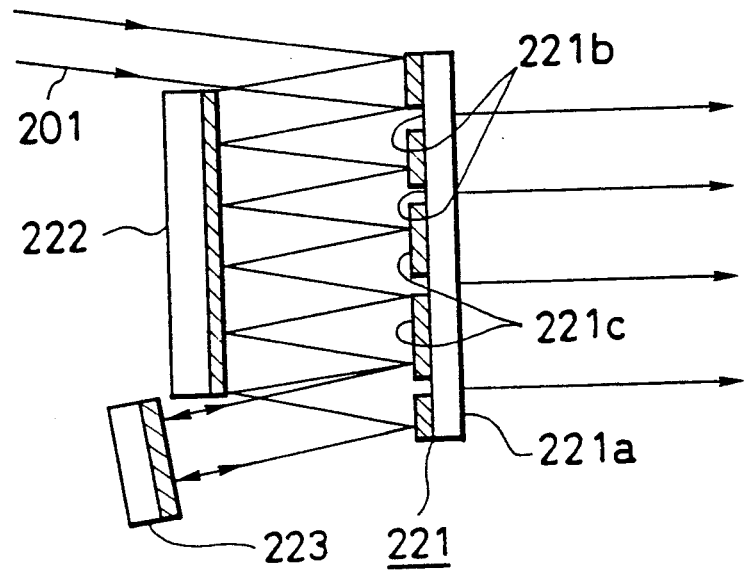

In the embodiment of FIG. 10, the part of the laser beam that is repeatedly reflected between the mask 221 and the flat mirror 222 and reached the lower end is wasted. However, by providing an additional mirror 223 at the lower end in such a way as to return the laser beam toward the mask, as shown in FIG. 11, the laser beam utilization factor is further increased.

Figure 12:
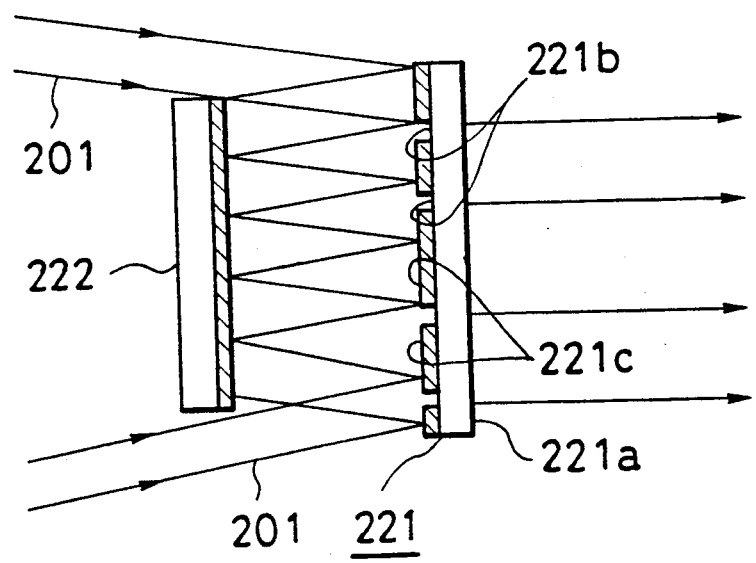

If two laser beams are made incident from two different directions, viz., from the upper end and the lower end, as shown in FIG. 12, on the mask 221, the irradiation through the mask is evener.

Figure 13:
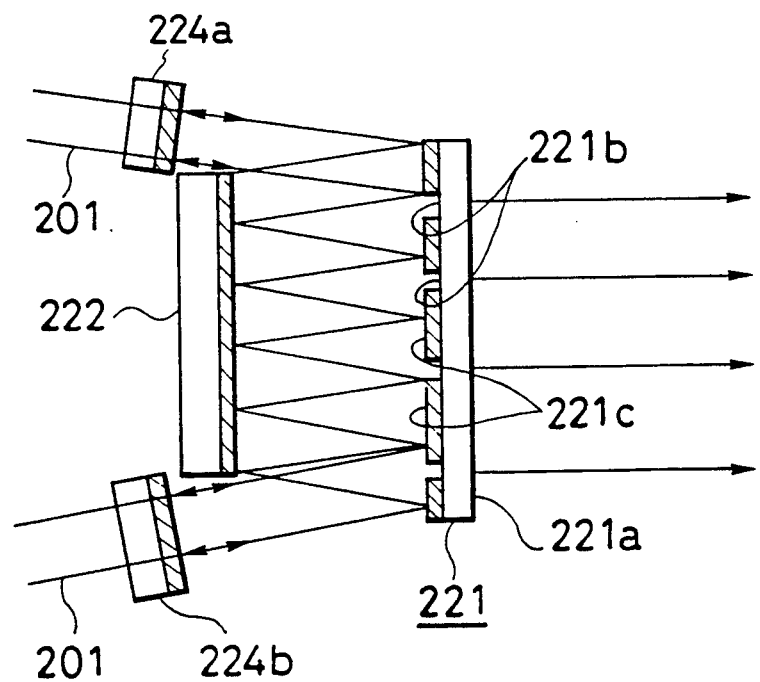

Moreover, as shown in FIG. 13, the laser beams may be made incident from the upper end and the lower end through half mirrors 224a and 224b. The half mirror 224b is arranged in the same way as the mirror 223 at the lower end in the embodiment of FIG. 11, such that the laser beam having arrived at and reflected at the lower end, after being reflected between the mask 221 and the mirror 222, is partly reflected back to lower end of the mask 221. The half mirror 224a is arranged at the upper end in a similar manner, such that the laser beam having arrived at and reflected at the upper end, after being reflected between the mask 21 and the mirror 222, is partly reflected back to the upper end of the mask 221.

In the various embodiments described above, the light other than laser beams may be used, and the invention is applicable to processing other than ablation machining, e.g., to exposure device in photolithography.

As has been described according to the above embodiments of FIG. 7 to FIG. 13, reflecting means is provided on the mask, and a reflective member is provided in opposition to the reflective means of the mask to reflect the light from the mask back to the mask. The utilization factor of light is therefore improved.

Figure 14:
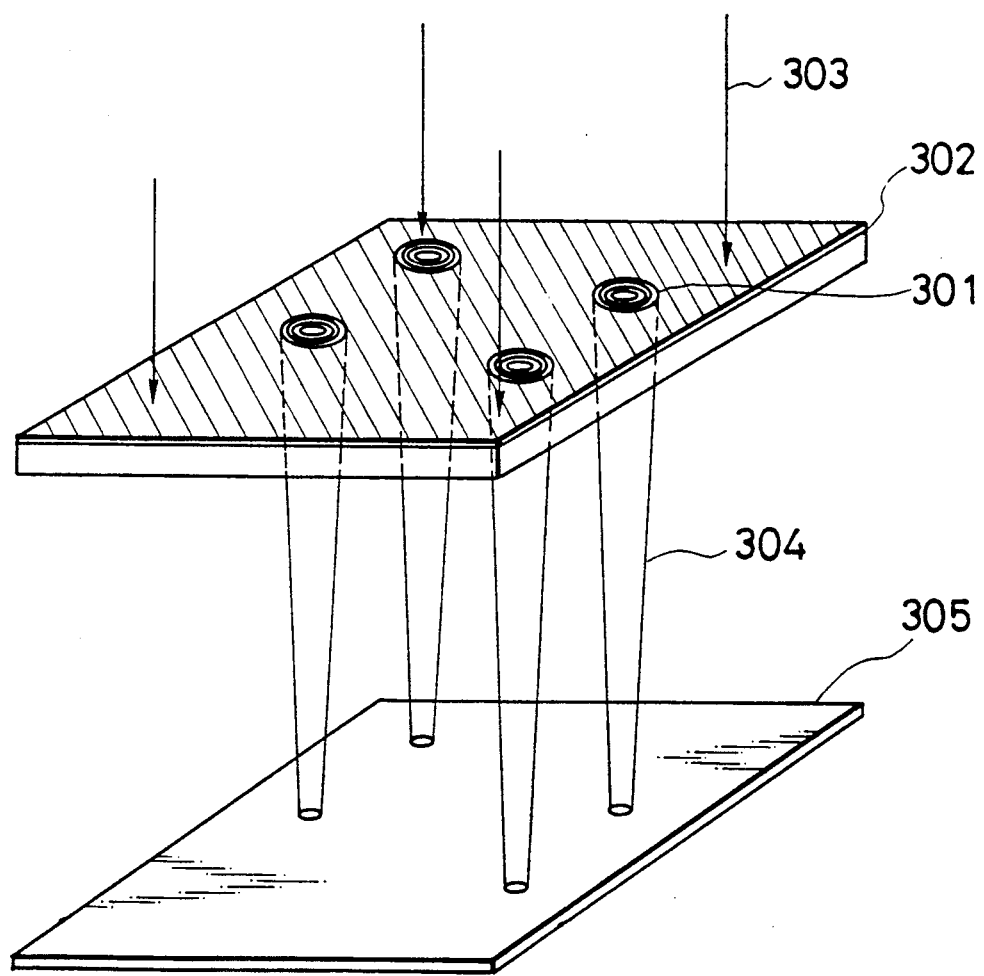
FIG. 14 is a schematic diagram of a further embodiment of the present invention.

Further embodiments of the invention will now be described with reference to FIG. 14. As illustrated, laser light 303 consisting of plane wave is supplied from a laser oscillator like than shown in the above embodiment, is incident on a mask pattern 302 having apertures of a Fresnel zone plate pattern 301, and laser light 304 also consisting of a plane wave that has passed through the aperture 301 is irradiated onto a workpiece 305.

Figures 15A, 15B:
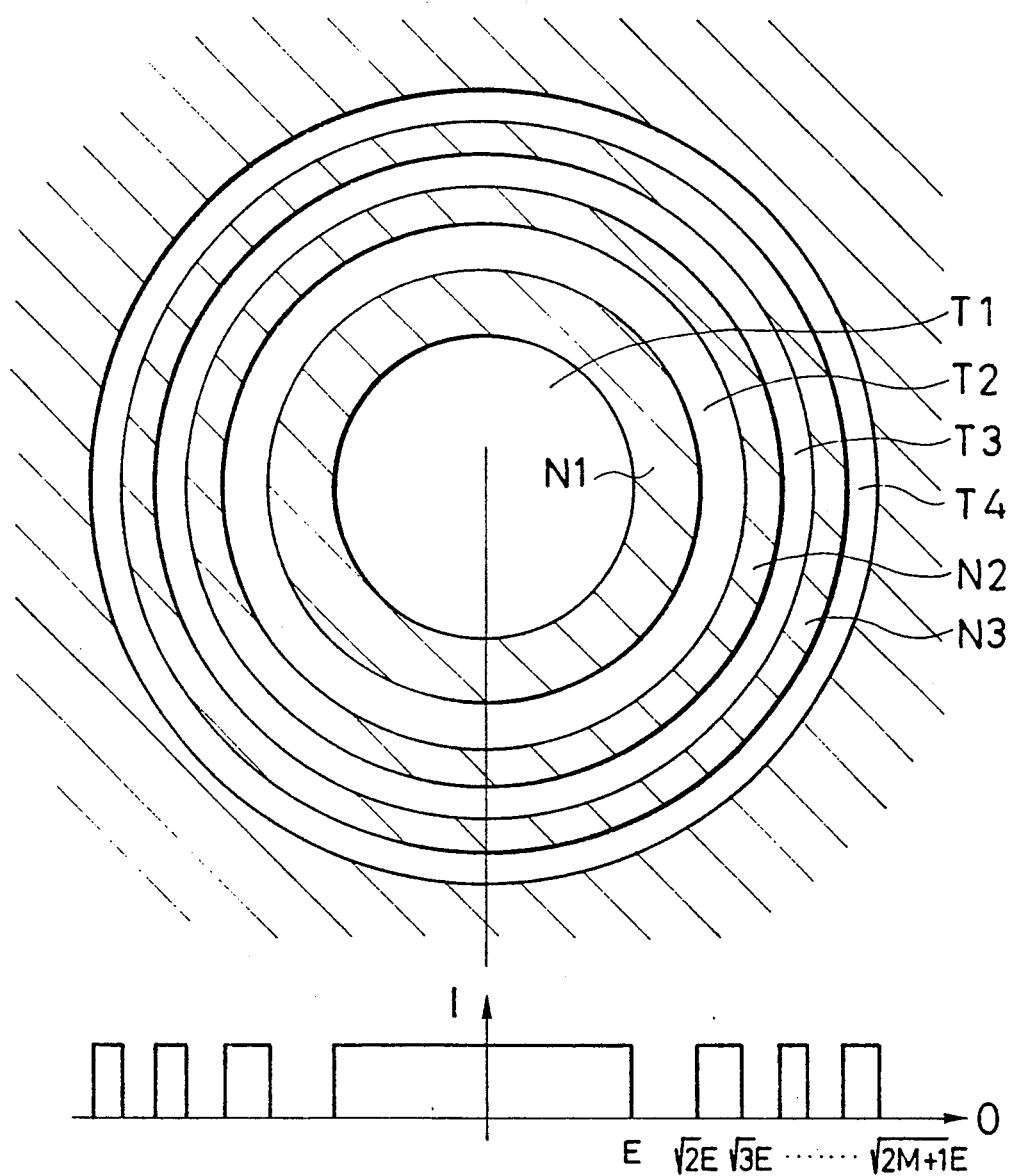
FIGS. 15A and 15B show details of a Fresnel zone plate.

The aperture of a Fresnel zone plate is illustrated in further detail in FIG. 15 at (A), in which the hatched areas correspond to "light nontransmissive" areas where light is not passed, while the unhatched areas correspond to "transmissive" areas where light is passed. At the center is a disk-shaped transmissive area $T_1$ having a radius E. Other transmissive areas $T_2$ to $T_M$ are annular or ring-shaped, and are separated from the central disk-shaped transmissive area or from each other, by annular or ring-shaped nontransmissive areas $N_1$ to $N_{(M-1)}$. The boundaries between a transmissive area and a nontransmissive area are circular, and the radius of the m-th boundary as counted from the innermost boundary to the outermost boundary is $E \cdot (2m+1)^{\frac{1}{2}}$. The distribution of intensity of light having passed the pattern is as shown in FIG. 15 at (B).

Figure 16:
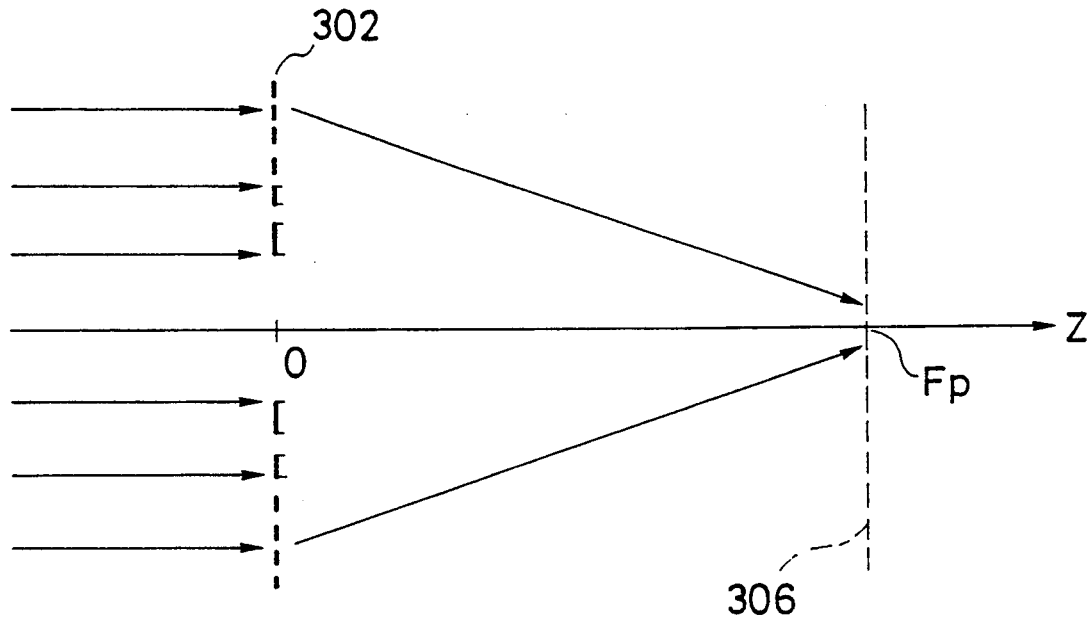
FIG. 16 shows the operation of the embodiment of FIG. 14.

The distance from the Fresnel zone plate 301 toward the direction in which the light is emitted is represented by Q, as shown in FIG. 16.

The operation will now be described with reference to FIG. 14, FIG. 15 and FIG. 16. When the laser beam having a plane wave is incident on the mask pattern 302 having a Fresnel zone plate 301, the laser beam 303 is diffracted and reaches the workpiece 305, which is thereby machined. The distribution of light on the mask pattern 302 is as shown in FIG. 15 at (B). The light with the distribution of the plane wave as shown in FIG. 15 at (B) is converted at a focal point Fp on the side where the light is emitted from the mask pattern 303, and light intensity at the focal point Fp is higher than at the mask pattern (FIG. 16). The relationship between the distance to the focal point, Fp, and the parameter E of the Fresnel zone plate is given by:

$$E^2/(\lambda \cdot F) = 1$$

where

λ is the wavelength of the laser light.

The intensity of light at the focal point Fp is given by:

$$I = M^2 \cdot Im$$

wherein

Im is the intensity of light on the mask pattern, and
M is the number of the Fresnel zone plate.

The number of the Fresnel zone plate is usually 6 to 10. Substituting these figures, the intensity of light is 36 times or 100 times the intensity of light on the mask pattern. If the Fresnel zone plate is provided with a plurality of mask patterns, hole-forming machining at a plurality of separated locations can be carried out concurrently.

The size of the Fresnel zone plate will be as follows: If the wavelength of light, λ, is 248 nm, and the focal length F is 50 nm, then E will be 111 μm. If M=10, the diameter of the Fresnel pattern will be $$E \cdot (2M+1)^{\frac{1}{2}} = 509 \ \mu m.$$

It will therefore be necessary that the distance between the holes must not be less than 509 μm.

Figure 17:
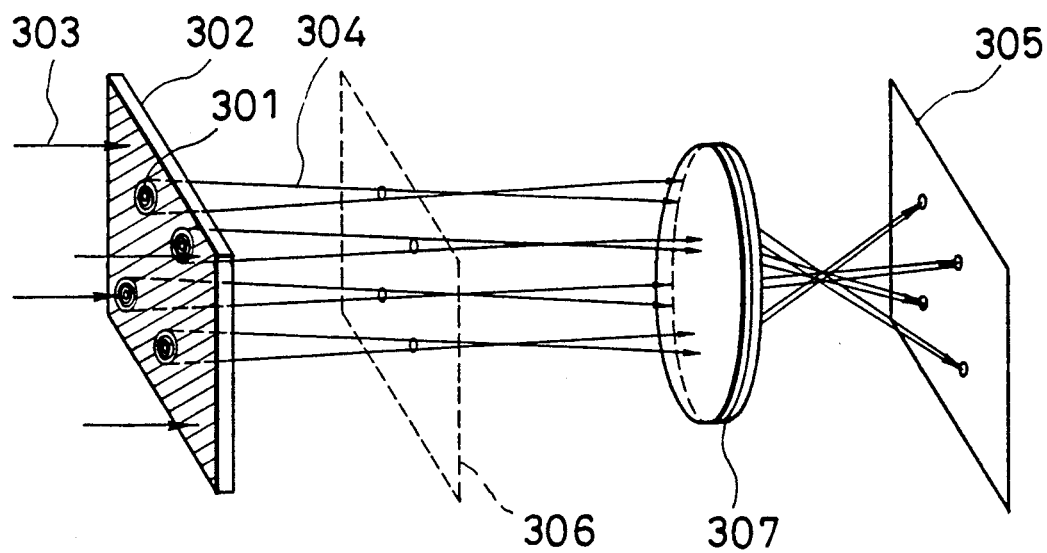
FIG. 17 is a schematic diagram of a further embodiment of the present invention.

In the embodiment described, the light emitted from the Fresnel zone plate is directly irradiated onto the workpiece. But as illustrated in FIG. 17, the distribution of light on the focal plane 306, at Fp, be transferred onto the surface of the workpiece, by use of an image-forming optical system 307.

The Fresnel zone plate used in the embodiment described above is configured as shown in FIG. 15, and if the first-order Bessel function is denoted by $J_1(r)$, the radius is represented by R, the Fresnel number is represented by N, and the distance to the outermost part of the Fresnel zone plate is represented by L, the intensity I of light at the focal point is given by:

$$I = c\{J_1(2N\pi R/L)/(N\pi R/L)\}^2$$

where c represents a constant of proportion.

If other patterns are used for the Fresnel zone plate pattern, the distribution of light at the focal point may be made similar to a shape of a rectangle or a ring. Moreover, by using a linear Fresnel zone plate pattern, it is possible to obtain a slit-shaped distribution of light.

It is also possible to use a microlens in place of the Fresnel zone plate.

As has been described according to the above embodiments, a mask having a plurality of Fresnel zone plate patterns having a focusing function is used, so the laser beam is utilized with a higher efficiency, and machining for forming hiles which are scattered can be achieved in a simple way, as in the case of a transfer optical system. The throughput is thereby substantially improved compared with the apparatus of the prior art.

What is claimed is:

1. An optical machining apparatus for irradiating a desired pattern of light from a light source onto a surface to be machined to form holes through the surface to be machined, comprising:

a mask disposed in a path of light emitting from the light source to the surface, said mask having reflective parts for totally reflecting the light from the light source on a first surface and light-transmissive parts corresponding to the desired pattern and permitting the light from the light source to pass therethrough, thereby irradiating the desired patterns of light onto the surface to be machined; and reflection means for returning light reflected at said reflective parts of said mask towards said mask mark.

2. The apparatus as set forth in claim 1, wherein said reflection means comprises a flat mirror disposed to confront said first surface of said mark and totally reflects light emitted from said second partially-reflective mirror toward said mask.

3. The apparatus as set forth in claim 1, wherein said reflection means comprises a spherical mirror shaped to allow light from said first partially reflective mirrors to pass therethrough and disposed to confront said first surface of said mask.

4. The apparatus as set forth in claim 1, wherein said light source is formed of an excimer laser.

5. An optical machining apparatus for irradiating light from a light source onto a surface to be machined to form holes through the surface to be machined, comprising:

a plurality of converging means for converging the light from the light source onto the surface to be machined;

said converging means including a Fresnel zone plate.

6. The apparatus as set forth in claim 5, further comprising a mask which includes a plurality of Fresnel zone plates.

7. The apparatus as set forth in claim 5, wherein the light source is formed of an excimer laser.

8. The apparatus as set forth in claim 2 wherein the light emitted from said one of said partially reflective mirrors is incident upon said mask at an angle less than 90°.

9. The apparatus as set forth in claim 8 wherein a surface area of the mask is greater than a surface area of said reflection means and said reflection means includes, a first mirror disposed parallel to said mask to reflect light reflected from said mask towards said mask; and a second mirror disposed non-parallel to said mask so as to reflect light that is reflected from said mask toward said mask and not reflected by said first mirror.

10. An apparatus for optically machining surfaces of plural work pieces, comprising:

a single light source; first and second partially-reflective mirrors positioned on opposite sides of said single light source;

a first mask disposed to receive light emitted from said first partially-reflective mirror, said first mask having reflective parts for totally reflecting light from said first partially-reflective mirror on a first surface of said first mask and light-transmissive parts having a desired pattern for permitting light from said first partially-reflective mirror to pass therethrough; and a second mask disposed to receive light from said second partially-reflective mirror, said second mask having reflective parts for totally reflecting light from said second partially-reflective mirror on a first surface of said second mask and light-transmissive parts having a desired pattern for permitting light from said second partially-reflective mirror to pass therethrough.

11. The apparatus as set forth in claim 10 further comprising:

first and second spherical mirrors, said first and second spherical mirrors being shaped to allow light from said first and second partially-reflective mirrors to pass therethrough and disposed to reflect light reflected from said reflective parts of said first and second masks toward said first and second masks, respectively.

* * * * *